(12) United States Patent
Casey et al.

(10) Patent No.: US 9,876,489 B1
(45) Date of Patent: Jan. 23, 2018

(54) METHOD OF IMPLEMENTING A DIFFERENTIAL INTEGRATING PHASE INTERPOLATOR

(71) Applicant: Xilinx, Inc., San Jose, CA (US)

(72) Inventors: Ronan Casey, Cork (IE); Catherine Hearne, Fermoy (IE); Jinyung Namkoong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/258,696

(22) Filed: Sep. 7, 2016

(51) Int. Cl.
| | |
|---|---|
| *H03K 5/05* | (2006.01) |
| *H03K 5/151* | (2006.01) |
| *H04L 7/00* | (2006.01) |
| *H03K 5/06* | (2006.01) |
| H03K 5/00 | (2006.01) |

(52) U.S. Cl.
CPC .............. *H03K 5/05* (2013.01); *H03K 5/06* (2013.01); *H03K 5/065* (2013.01); *H03K 5/1515* (2013.01); *H04L 7/0025* (2013.01); *H03K 2005/00052* (2013.01)

(58) Field of Classification Search
CPC .................. H03K 5/1515; H03K 2005/00052
See application file for complete search history.

(56) References Cited

U.S. PATENT DOCUMENTS 6,380,783 B1 * 4/2002 Chao ..................... H03K 5/08
327/239

7,038,520 B2 * 5/2006 Chiba ....................... G06F 1/04
326/30

(Continued)

OTHER PUBLICATIONS

Agrawal, Ankur et al., "A 19Gb/s Serial Link Receiver with Both 4-Tap FFE and 5-Tap DFE Functions in 45nm SOI CMOS," Proc. of the 2012 IEEE International Solid-State Circuits Conference, Feb. 19, 2012, pp. 134-136, IEEE, Piscataway, New Jersey, USA.

(Continued)

*Primary Examiner* — Thomas J Hiltunen
(74) *Attorney, Agent, or Firm* — John J. King; Robert M. Brush

(57) ABSTRACT

The phase interpolator comprises a first charge pump configured to receive a first differential clock signal having a first clock phase, wherein the first charge pump has a first current path and a second current path coupled between a first pull-up current source and a first pull-down current source, wherein the first current path comprises a first NMOS steering switch coupled between a first output node and the first pull-down current source and the second current path comprises a second NMOS steering switch coupled between a second output node and the first pull-down current source; and a second charge pump configured to receive a second differential clock signal having a second clock phase, wherein the second charge pump has a third current path and a fourth current path coupled between a second pull-up current source and a second pull-down current source, and wherein the third current path comprises a third NMOS steering switch coupled between the first output node and the second pull-down current source and the fourth current path comprises a fourth NMOS steering switch coupled between the second node and the second pull-down current source.

17 Claims, 12 Drawing Sheets

(56) References Cited

U.S. PATENT DOCUMENTS

| | | | | |
|---|---|---|---|---|
| 7,466,179 | B2* | 12/2008 | Huang | H03K 5/088 327/231 |
| 7,593,496 | B2* | 9/2009 | Fan | H03H 11/16 327/231 |
| 7,764,086 | B2* | 7/2010 | Lu | H03K 19/00323 326/82 |
| 7,913,104 | B1 | 3/2011 | Cory et al. | |
| 8,081,024 | B1* | 12/2011 | Evans | H03K 5/13 327/175 |
| 8,558,597 | B2* | 10/2013 | Agrawal | H04L 27/01 327/231 |
| 8,896,358 | B2* | 11/2014 | Hood | H03K 5/13 327/231 |
| 8,995,514 | B1 | 3/2015 | Asuncion et al. | |
| 9,065,601 | B1 | 6/2015 | Jenkins et al. | |
| 9,160,345 | B1* | 10/2015 | Gorecki | H03K 5/135 |
| 9,225,324 | B2* | 12/2015 | Arcudia | H03K 5/1565 |
| 9,325,489 | B2 | 4/2016 | Hsieh et al. | |

OTHER PUBLICATIONS

Dickson, Timothy O. et al., "A 1.8-pJ/bit 16×16-Gb/s Source Synchronous Parallel Interface in 32nm SOI CMOS with Receiver Redundancy for Link Recalibration," Proc. of the 2015 IEEE Custom Integrated Circuits Conference, Sep. 28, 2015, pp. 1-4, IEEE, Piscataway, New Jersey, USA.

Frans, Yohan, "A 0.5-16.3 Gb/s Fully Adaptive Flexible-Reach Transceiver for FPGA in 20 nm CMOS," IEEE Journal of Solid-State Circuits, Aug. 2015, pp. 1932-1944, vol. 50, No. 8, IEEE, Piscataway, New Jersey, USA.

Ryu, Sigang et al., A 9.2-GHz Digital Phase-Locked Loop with Peaking-Free Transfer Function, Proc. of the 2013 IEEE Custom Integrated Circuits Conference, Sep. 22, 2013, pp. 1-4, IEEE, Piscataway, New Jersey, USA.

* cited by examiner

US 9,876,489 B1

METHOD OF IMPLEMENTING A DIFFERENTIAL INTEGRATING PHASE INTERPOLATOR

TECHNICAL FIELD

The present invention relates generally to data receivers, and in particular, to a phase interpolator and a method of implementing a phase interpolator.

BACKGROUND

Phase interpolators have many applications in high-speed clocking/timing circuits. One application is in clock and data recovery (CDR). Clock and Data Recovery has applications in the high-speed serial I/O circuits found in field programmable gate arrays (FPGAs), memories, and other integrated circuit devices. Another application is the compensation for differing clock frequencies in two clock domains, either on-chip or inter-chip, by using continuous phase rotation to realize a frequency delta from the incoming clock source. Another application is the clock alignment of two or more clocks.

However, different implementations of phase interpolators can consume different amounts of power and lead to different degrees of phase linearity of an output signal. Waveforms generated by conventional current-integrating phase interpolators are not balanced/differential waveforms, and furthermore may have significant Duty Cycle Distortion (DCD), where the ratio of the time duration of the positive or "high" voltage portion of the pulse to the waveform period is not the desired ratio. Both of these attributes degrade performance of the clock signals, resulting in the need for additional correction circuitry to recover the signal. While Current Mode Logic (CML) phase interpolator solutions may have balanced/differential signaling and have better DCD than the other conventional devices, they require signal conditioning/wave-shaping at the interpolator input and/or output in order to achieve good linearity. More particularly, these CML interpolators mix current into a resistor load or a combined resistor and inductor load, rather than into a capacitor where the current charging of a capacitor is more linear, and therefore provide improved linearity. However, these CML solutions do not scale very well with data rate and incur extra area and wave shaping for broadband operation.

Accordingly, circuits and methods that improve the performance of a phase interpolator are beneficial.

SUMMARY

A phase interpolator is described. The phase interpolator comprises a first charge pump configured to receive a first differential clock signal having a first clock phase, wherein the first charge pump has a first current path and a second current path coupled between a first pull-up current source and a first pull-down current source, wherein the first current path comprises a first NMOS steering switch coupled between a first output node and the first pull-down current source and the second current path comprises a second NMOS steering switch coupled between a second output node and the first pull-down current source; and a second charge pump configured to receive a second differential clock signal having a second clock phase, wherein the second charge pump has a third current path and a fourth current path coupled between a second pull-up current source and a second pull-down current source, and wherein the third current path comprises a third NMOS steering switch coupled between the first output node and the second pull-down current source and the fourth current path comprises a fourth NMOS steering switch coupled between the second node and the second pull-down current source.

Another phase interpolator comprises an array of current steering charge pumps, each current steering charge pumps comprising a first charge pump configured to receive a first differential clock signal having a first clock phase, wherein the first charge pump has a first current path and a second current path, wherein the first current path comprises a first NMOS steering switch coupled between a first output node and ground and the second current path comprises a second NMOS steering switch coupled between a second output node and ground; and a second charge pump configured to receive a second differential clock signal having a second clock phase, wherein the second charge pump has a third current path and a fourth current path, wherein the third current path comprises a third NMOS steering switch coupled between the first output node and ground and the fourth current path comprises a fourth NMOS steering switch coupled between the second node and ground.

Other features will be recognized from consideration of the Detailed Description and the Claims, which follow.

DETAILED DESCRIPTION

Figure 1:
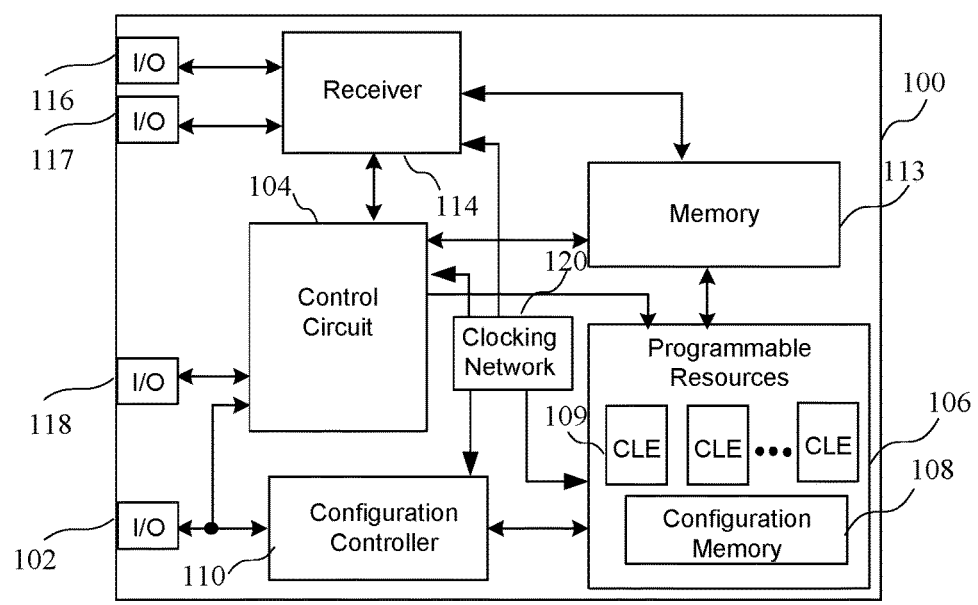
FIG. 1 is a block diagram of an integrated circuit comprising a circuit for receiving data in the integrated circuit.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods enable the linear phase interpolation of two signals. The circuits and methods achieve high performance, comparable with conventional devices, but with low power consumption and with significantly less signal degradation. The circuits and methods can be compatible with low power supply (e.g. sub-1V) operation and can interpolate either CMOS or CML style input signals. The circuit uses two complementary differential charge pumps, charging either one or two common capacitors, to mix/combine the input phases of each charge pump, thus achieving an output phase that is a linear interpolation between the two input phases.

Fully complementary PMOS current source and switches and NMOS current sink and switches allow for symmetric rise/fall waveforms and differential operation, where the single-end signals differ only in phase and are 180 degrees apart. That is, the duty cycle is maintained at or near 50% and the signals are balanced and therefore more immune to supply noise injection. Improvements in DCD and signal balancing are of significance in high performance clocking.

Furthermore, the constant charge pump output voltage waveform slope around the differential voltage zero crossing versus interpolation ratio leads to a circuit that is less susceptible to AM-PM distortion later in the signal chain. The circuit can easily be tuned versus data rate by adjusting the values of current sources, either through variable biasing of the current source transistors, or by implementing them as a current DACs. This tuning capability of the current sources provides an easy-to-implement and area-and-power-efficient scaling versus frequency of operation. If it is necessary to maintain a good operating point for the unit current sources and unit steering switches over a range of input clock frequencies, their size and the size of the mixing capacitors ($C_{MIX}$, $C_{MIXb}$) can also be made programmable (i.e. more or less units can be enabled in parallel) and varied as the input clock frequency is varied. Waveforms generated by the circuits and methods set forth below do not have DCD problems inherent in conventional devices, and furthermore do not require signal conditioning/wave shaping at the interpolator input. Such additional signal conditioning/waveform shaping can often require a dedicated buffer stage that may need to be tuned as the input frequency is varied. The circuits achieve a fully differential, complementary current integrating phase interpolator with minimal duty cycle distortion and fully differential signaling. The circuits also scale well with operating frequency.

If the current in first charge pump is different than the current in the second charge pump, then the output phase (relative to the input clock phases) should be approximately proportional to a linear weighting of the input phases (where that weighting corresponds to the ratio of the currents in each charge pump). Controlled phase interpolation can be achieved by choosing this ratio of currents appropriately, either by changing the bias of the current source transistors, or by realizing the current sources using a current DAC as will be described in more detail below.

Turning first to FIG. 1, a block diagram of an integrated circuit 100 comprising a circuit for receiving data in the integrated circuit is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. A phase interpolator could be implemented to enable the operation of the receiver of FIG. 1, for example.

Figure 2:
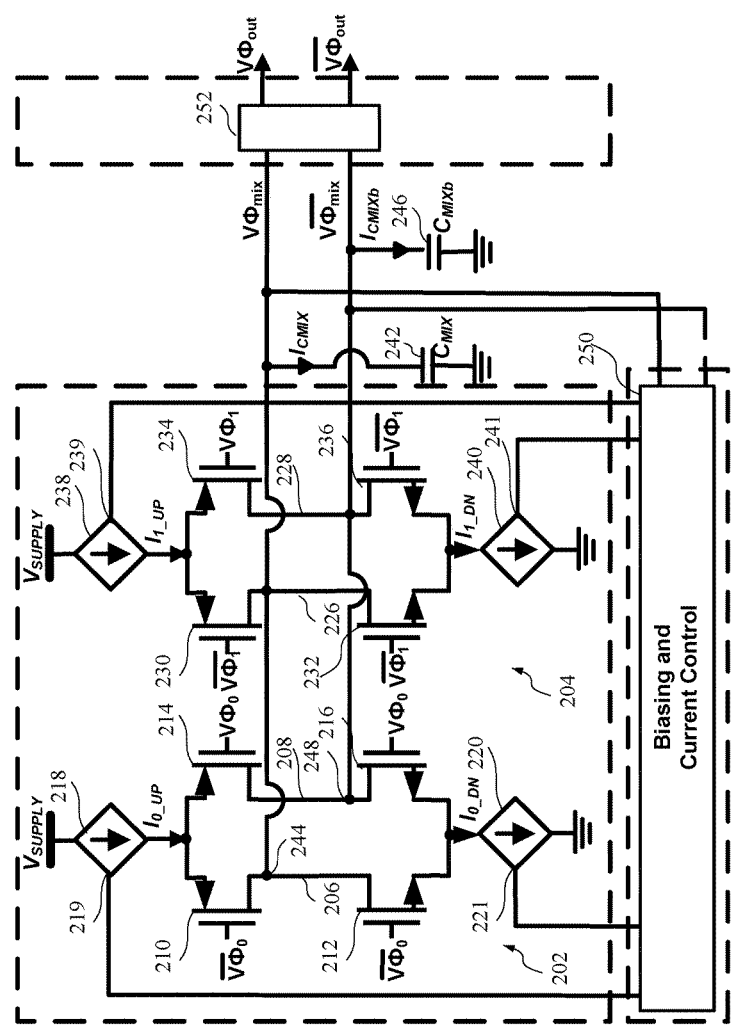
FIG. 2 is a block diagram of a phase interpolator.

Turning now to FIG. 2, a block diagram of a phase interpolator is shown. The phase interpolator, often called a phase mixer, takes two differential input signals, which are generally periodic waveforms, called "clocks" of different phases. The first pair of differential signals are denoted with the "0" suffix, where the phases are called φ0 and φ0b (or φ0_bar)). By convention, the actual differential voltage signal is defined as φi0 voltage waveform (Vφ0) minus the φi0b voltage waveform (Vφ0_bar). This differential signal is called Vφ0d, where the "d" is for "differential". The second differential signal pair are denoted with the "1" suffix (i.e. Vφ1d is the differential voltage signal). The phase interpolator can be thought of as two complementary differential charge pumps with common output capacitor loads, which can be single-ended or differentially connected. The first charge pump is called CP0 and receives Vφ0d, and second charge pump is CP1 and receives Vφ1d. The Vφ1d signal is the same as Vφ0d except that it has a pre-defined phase shift.

Figure 4:
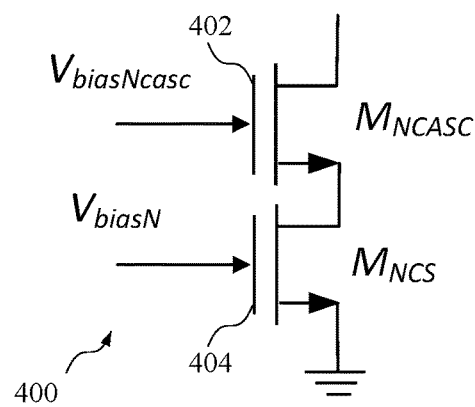
FIG. 4 is a block diagram of a current source implemented in the phase interpolator of FIG. 2.

Referring specifically to FIG. 2, phase interpolator of FIG. 2 comprises a first charge pump 202 (CP0) and a second charge pump 204 (CP1). The first charge pump 202 comprises a first current path 206 and a second current path 208, where each current path comprises controllable, current steering switches, shown here as CMOS transistors. In particular, current path 206 comprises a first PMOS transistor 210 coupled in series with a first NMOS transistor 212. The second current path 208 comprises a second PMOS transistor 214 coupled in series with a second NMOS transistor 216. A clock signal having a first phase (Vφ$_0$) and the inverted clock signal (Vφ$_0$_bar) having the first phase, are coupled to the control terminals (e.g. gates) of the transistors of the current paths as shown. The inverted clock signal of the first phase is 180° apart from the clock signal of the first phase. A first pull-up current source 218, configured to receive a current bias control signal at an input 219, is provided between a supply voltage (V$_{supply}$) and a common node at the sources of the transistors 210 and 214. A pull down current source 220, also known as a current sink and configured to receive a current bias control signal at an input 221, is implemented between a common node at the sources of the transistors 212 and 216 and a ground potential. An example of the pull-down current source is shown in FIG. 4. A PMOS pull-up equivalent for a pull-up current source can have a similar topology, as in FIG. 4 except with PMOS transistors.

The second charge pump 204 comprises a third current path 226 and a fourth current path 228, were each current path comprises controllable, current steering switches, also shown here as CMOS transistors. Current path 226 comprises a third PMOS transistor 230 coupled in series with a third NMOS transistor 232. The second current path 228 comprises a fourth PMOS transistor 234 coupled in series with a fourth NMOS transistor 236. A clock signal having a second phase (V$\varphi_1$) and the inverted clock signal (V$\varphi_1$_bar) of the second phase, which may also be 180° apart from the clock signal of the second phase, are coupled to the gates of the transistors of the current paths as shown. A second pull-up current source 238, configured to receive a current bias control signal at an input 239, is provided between a supply voltage (V$_{supply}$) and a common node at the sources of the transistors 230 and 234. A current sink 240, also known as a pull-down current source and configured to receive a current bias control signal at an input 241, is provided between a common node at the sources of the transistors 232 and 236 and a ground potential.

A first capacitor 242 (C$_{MIX}$) is coupled to a first output node 244 at the drains of the transistors 210 and 212, while a second capacitor 246 (C$_{MIXb}$) is coupled to a second output node 246 at the drains of the transistors 214 and 216. The output signals V$\varphi_{mix}$ and V$\varphi_{mix}$_bar are generated based upon currents I$_{CMIX}$ and I$_{CMIXb}$ that flow into the capacitors 242 and 246 at the outputs 244 and 248. A biasing and current control circuit 250 provides bias control signals to the pull-up current sources 218 and 238 and the pull-down current sources 220 and 240, as will be described in more detail below. The output signals V$\varphi_{mix}$ and V$\varphi_{mix}$_bar are coupled to a buffering and signal conditioning circuit 252 to generate the output signals V$\varphi_{out}$ and V$\varphi_{out}$ bar as will also be described in more detail below.

Figure 3:
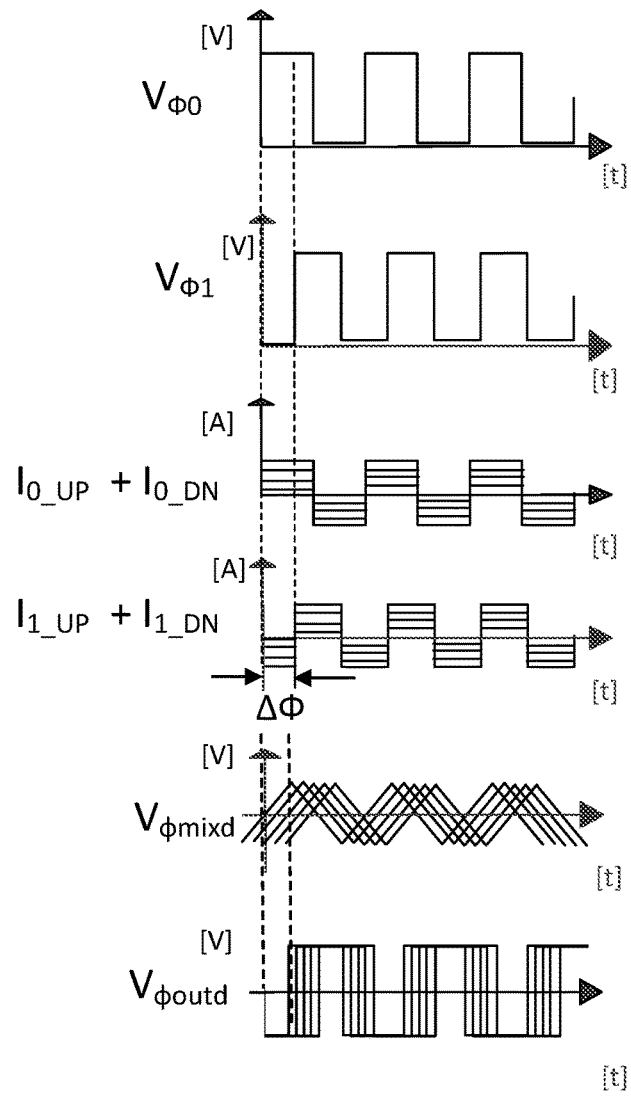
FIG. 3 includes timing diagrams showing the implementation of the phase interpolator of FIG. 2.

In order to understand the interpolation function, it is necessary to first consider CP0 and CP1 separately, and then consider the effect of when they are added together, because there is a linear summation of the CP0 and CP1 currents in Cmix. When V$\varphi$0 is high (for 180 degrees of the clock period) it switches/sources CP0's I$_{0\_Up}$ into C$_{mix}$ and charges it constantly to produce a linearly increasing voltage on the $\varphi$Mix node (i.e. output 244). Meanwhile V$\varphi$0 also generates switching/sinking current I$_{0\_dn}$ from Cmixb to produce a linearly decreasing voltage on the $\varphi$Mixb node (i.e. output 248). These signals are differential (i.e. equal in magnitude and phase, but opposite in direction). When V$\varphi$0 is low (for the remaining 180 degrees of the clock period), the reverse happens. That is, the voltage on the $\varphi$Mix node (i.e. output 244) deceases linearly and the voltage on the $\varphi$Mixb node increases linearly. As shown in FIG. 3, different combinations of I$_0$ and I$_1$ leads to different V$\varphi_{mixd}$ outputs. The V$\varphi_{mixd}$ signal over the first and seconds halves of the period are symmetrical around the center point of the period where the rise time is equal to fall time as shown in FIG. 3, thus preserving duty cycle (i.e. signal V$\varphi_{out}$ and V$\varphi_{outb}$ that have little DCD). That is, by providing a constant current into the capacitors, a symmetric V$\varphi_{mixd}$ signal can be achieved where the rising and falling slopes of the V$\varphi_{mix}$ signal are the same and each represent one half of a clock period rather than a sawtooth waveform, eliminating duty cycle distortion. While the circuit of FIG. 2 is shown as receiving a differential clock signal, it should be understood that single-ended signals could be employed in each of the embodiments set forth below. Also, while separate capacitors are coupled to the output nodes in the various figures showing a phase interpolator, it should be understood that a single differential capacitor could be implemented between the output nodes of the phase interpolators. The capacitors could be implemented in different ways. It could be a MOS capacitor (NMOS or PMOS), an "N-Well" Capacitor, a Metal-Oxide-Metal ("MOM") capacitor, or a Metal-Insulator-Metal ("MIM") capacitor. It could also be parallel-connected back-to-back NMOS or parallel-connected back-to-back PMOS or and NMOS connected in parallel with a PMOS. Further, the capacitances could be formed as a part of the integrated circuit layout, the capacitances could be achieved due to device and metal parasitics due to other circuits and metal layers.

It should be noted that the phases of the currents are related to V$\varphi$0's phase. When V$\varphi$1 is high (which begins later than it did for V$\varphi$0, due to the phase delta between the two signals), it charges the Cmix node with a constant current, and discharges Cmixb with a constant current. On the second half of the V$\varphi$1 period, the opposite happens. It should be noted that the time period over which the charging, discharging happens is related directly to the phase of V$\varphi$1. When the single-ended CP0 and CP1 currents sum in Cmix, they do so linearly, and because V$\varphi$0 and V$\varphi$1 differ in phase, the combined phase of V$\varphi$Mixd is a linear sum of V$\varphi$0 and V$\varphi$1. The contribution or weight/strength of each phase can be influenced using the I$_0$/I$_1$ current ratio. More I$_0$ current means V$\varphi$0 will have more of an influence. More I$_1$ will mean that V$\varphi$1 will have more of an influence. That is, the differential output phase V$\varphi$Mixd of the phase interpolator can be approximated as V$\varphi$Mixd=(I0*V$\varphi$0+I1*V$\varphi$1)/(I0+I1). As is apparent from FIG. 3, the V$\varphi_{mixd}$ signals have an equal rising edge and falling edge slope. As can also be seen in the V$\varphi_{out}$ and V$\varphi_{out}$_bar have a 50-50 duty cycle as desired. It should be noted that the inputs to the charge pump differential pairs are differential signals, so they do not have to have levels as big as CMOS. Rather, the differential voltage need only be large enough to steer the differential pair, which is less than the differential CMOS swing. For example, CML signaling would provide enough swing, and any digital logic before the charge pump differential pairs could be of CML type.

Turning now to FIG. 4, a block diagram of a current source 400 that could be implemented as a current source in the phase interpolator of FIG. 2 is shown. The current source of FIG. 4 comprises a first NMOS transistor 402 coupled in series with a second NMOS transistor 404 with its source connected to the negative power supply, where a cascade bias voltage (V$_{biasNcasc}$) is coupled to a gate of the transistor 402 and N bias voltage (V$_{biasN}$) is coupled to a gate of the transistor 404. Alternatively, a current source having just the transistor 404 could be implemented. The current sources could be used to vary the charge pump current versus output phase by varying the gate bias of transistor current sources. Alternatively, thermometer or binary weighted current sources (or a segmented combination of binary and thermometer weighted current sources) or current source DACs (simple or cascoded) could be implemented as a charge pump. A similar configuration of PMOS transistors could be implemented as a pull-up current source.

Figure 5:
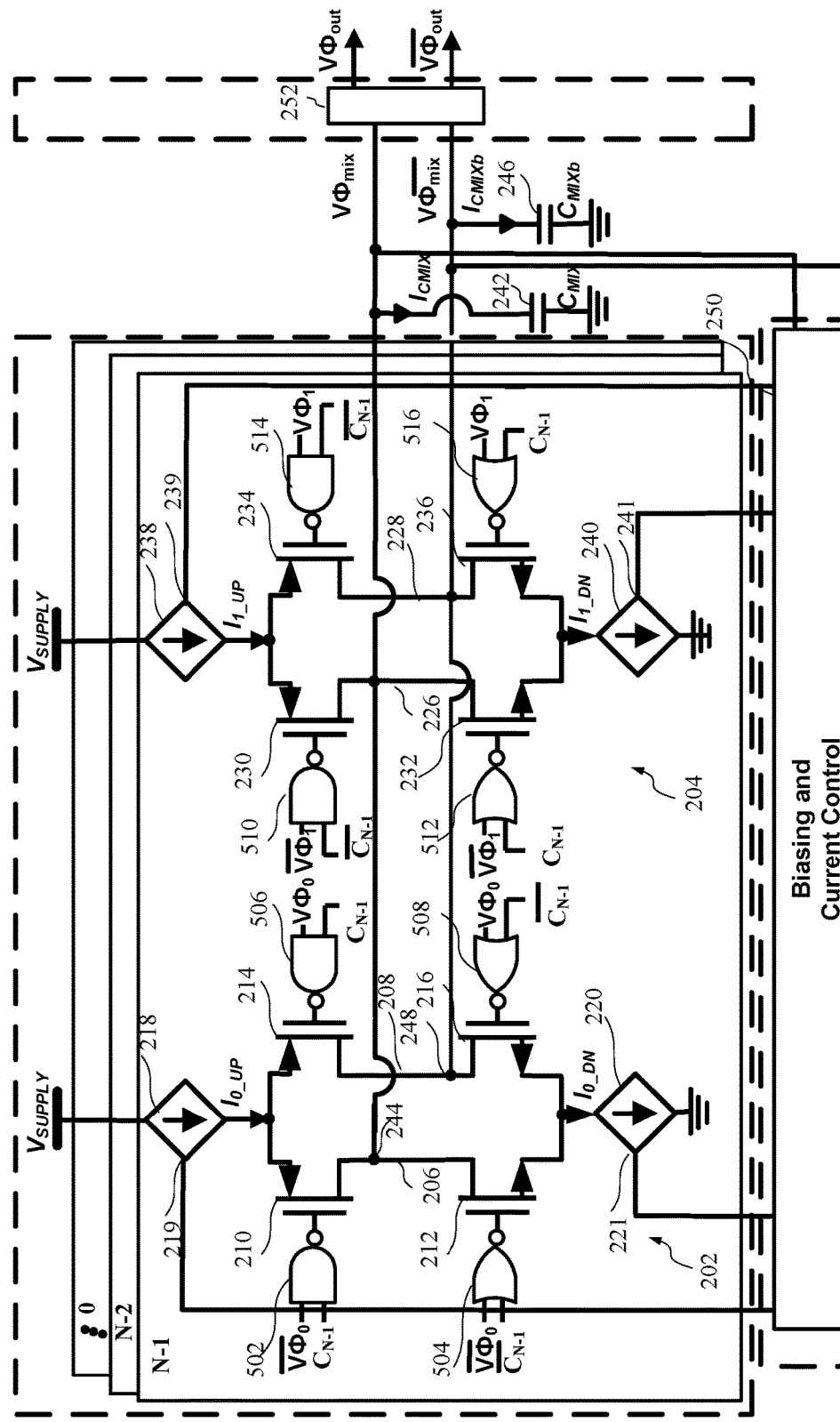
FIG. 5 is a block diagram showing an implementation of a phase interpolator and control logic using an array of N parallel pairs of charge pump units to form a phase digital-to-analog DAC type of phase interpolator with N discrete phase steps.

Turning now to FIG. 5, a block diagram shows an implementation of a phase interpolator using an array of parallel pairs of current-steering charge pumps and control logic. As shown in the circuit of FIG. 5, N separate pairs of charge pumps (<N-1:0>) configured in parallel and having outputs coupled to capacitors 242 and 246 are controlled by control logic to enable the selection of the individual charge pumps that contribute to the charging of capacitors 242 and 246. Gates are provided to enable the application of the clock phase signals to the gates of the transistors and control signals which determine whether individual charge pumps contribute to charging the capacitors. While a single unit (i.e. a single pair of charge pumps for the N-1 unit) is shown receiving the control signal at the control logic, it is understood that there are N-1 units each having a pair of charge pumps which receives a corresponding control signal at the control logic for that pair of charge pumps. For example, NAND gates are provided at the gate of the PMOS transistors above the output nodes 244 and 248 in each pair of charge pumps, while NOR gates are provided at the gates of the NMOS transistors below the output nodes 244 and 248. More particularly, the NAND gates at the gates of the PMOS transistors are coupled to receive both the phase of the clock signal as shown in FIG. 2, as well as a control signal associated with a corresponding charge pump unit of the charge pump pairs.

As shown in FIG. 5, NAND gates 502 are coupled to receive the inverted phase of the clock 0 signal $V\varphi 0$ at a first input and control signals corresponding to each of the parallel charge pumps (e.g. $C_{N-1}$ for the N-1 parallel unit of the plurality of charge pump units and $C_{N-2}$ for the N-2 unit of the plurality of charge pump unit). Furthermore, focusing on a single unit, a NOR gate 504 is coupled to the gate of the transistor 212, where the inverted phase of the clock 0 signal $V\varphi_{0\_bar}$ is provided to a first input and the inverted control signal is provided to the second input. A NAND gate 506 coupled to the transistor 214 is configured to receive the clock zero signal and a corresponding control signal at its inputs. Similarly, a NOR gate 508 coupled to the gate of the transistor 216 is configured to receive the clock zero signal and the inverted control signal at its inputs. The same logic functionality could be achieved with any logic type, a few of which include other CMOS logic gate types, tri-state logic, pass-gate logic, or domino logic, for example.

The second charge pump 204 is also configured to receive a phase of the clock signal and control signals at NAND gates and NOR gates of the control logic, where a NAND gate 510 is configured to receive the inverted phase of clock one signal and a corresponding inverted control signal, and a NOR gate 512 is configured to receive the inverted clock one signal and a corresponding non-inverted control signal. Similarly, the current path 228 of the second charge pump comprises a NAND gate 514 coupled to the gate of the transistor 234 and configured receive the inverted phase one clock signal and a corresponding inverted control signal, and a NOR gate 516 coupled to the gate of the transistor 236 and configured receive the phase of the clock one signal and a corresponding control signal. By implementing the parallel charge pump units and control logic, greater control can be achieved over the phase of the clock signal generated at the output of the phase interpolator.

Figure 6:
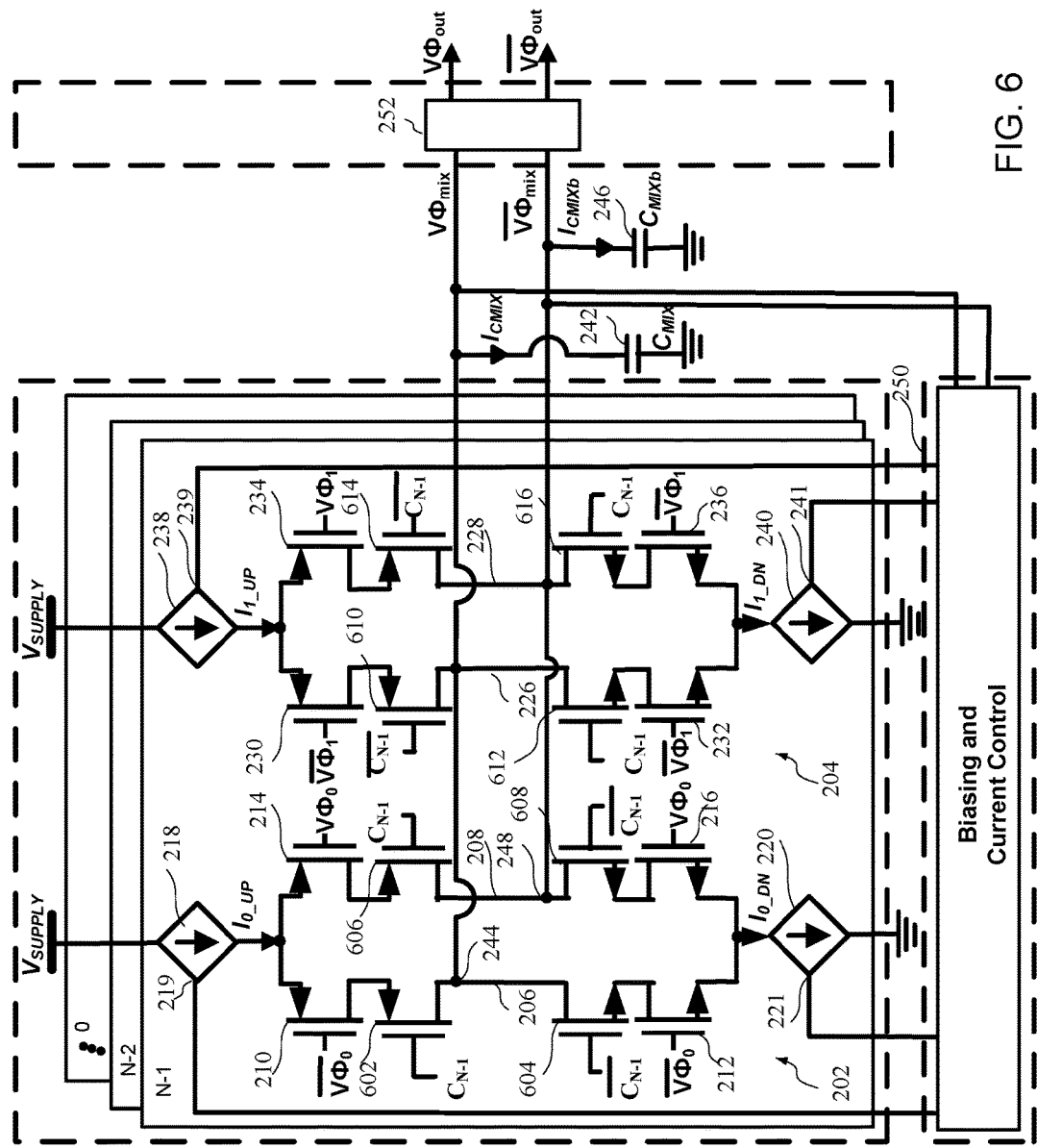
FIG. 6 is a block diagram showing an implementation of a phase interpolator charge pump array with stacked switches according to a first implementation.

Turning now to FIG. 6, a block diagram shows an implementation of parallel charge pump units with stacked switches according to a first implementation. The arrangement of parallel charge pumps in FIG. 6 is similar to the arrangement of FIG. 5, where each parallel charge pump for each of the N-1 charge pump pairs is implemented as shown in FIG. 6. The charge pumps of FIG. 6 include stacked transistors, where additional control transistors are provided (in place of the NAND or NOR logic) in the current paths to enable the current in the unit output paths. In the implementation of FIG. 6, control transistors are provided between the existing PMOS transistors and the nodes 244 and 248 above the nodes 244 and 248, while a control transistors are also provided between the nodes 244 and 248 and the existing NMOS transistors of the path as shown in FIG. 5. More particularly, a PMOS transistor 602 is provided between the transistor 210 and the output node 244, while an NMOS transistor 604 is provided between the output node 244 and the NMOS transistor 212 in the first current path of the first charge pump 202. In the second current path of the first charge pump 208, a PMOS transistor 606 is provided between the transistor 214 and the output node 248, while an NMOS transistor 608 is provided between the output node 248 and the NMOS transistor 216.

Similarly, in the second charge pump, a PMOS transistor 610 is provided between the transistor 230 and the output node 244, while an NMOS transistor 612 is provided between the output node 244 and the NMOS transistor 232 in the first current path of the second charge pump 204. In the second current path of the second charge pump 204, a PMOS transistor 614 is provided between the transistor 234 and the output node 248, while an NMOS transistor 616 is provided between the output node 248 and the NMOS transistor 236. Accordingly, each of the N-1 charge pump pairs can be separately selected by the control signals coupled to the gates of transistors 602-616 to vary the amount of contribution of the phase interpolator to the phase of the output signal. This solution is more compact in area compared to the logic (i.e. NAND/NOR) arrangement of FIG. 5. Furthermore, if necessary, the implementation of the stacked switches can also allow a soft enabling of the current sources units when changing the number of units enabled to prevent phase overshoot when changing the phase interpolator output phase. This soft enabling can be achieved by controlling the slew-rate of the control bits for example.

Figure 7:
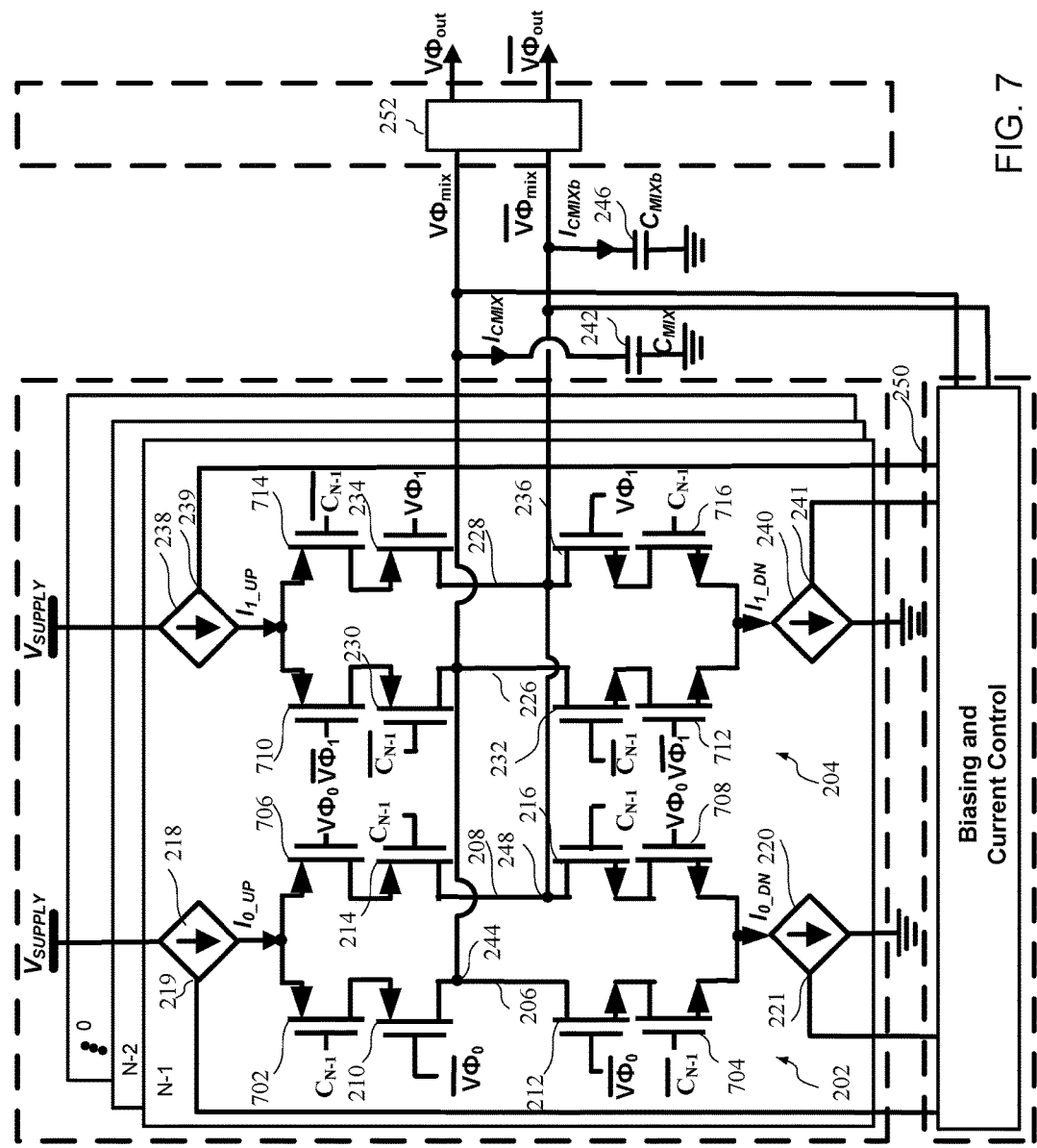
FIG. 7 is a block diagram showing an implementation of a phase interpolator charge pump array with stacked switches according to a second implementation.

Turning now to FIG. 7, a block diagram shows an implementation of parallel phase interpolators with stacked switches according to a second implementation. According to the implementation of FIG. 7, the order of the transistors added to the configuration of FIG. 6 is switched. In particular, an NMOS transistor 702 is provided between the current source 218 and the PMOS transistor 210. An NMOS transistor 704 is coupled between the NMOS transistor 212 and the current source 220. In the second current path of the first charge pump 202, a PMOS transistor 706 is coupled between the current source 218 and the PMOS transistor 214, while an NMOS transistor 708 is coupled between the NMOS transistor 216 and the current source 220. In the second charge pump 204, a PMOS transistor 710 is provided between the current source 238 and the PMOS transistor 230. An NMOS transistor 712 is coupled between the NMOS transistor 232 and the current source 240. In the second current path of the second charge pump 204, a PMOS transistor 714 is coupled between the current source 238 and the PMOS transistor 234, while an NMOS transistor 716 is coupled between the NMOS transistor 236 and the current source 240. Providing clock switches on the capacitor nodes leads to a more stable drain voltage for the current sources and reduces clock glitches if larger clock switches are needed for speed.

The current source could be a unitized, and therefore possibly thermometer or binary weighted DAC. FIG. 5, FIG. 6 and FIG. 7 are all unitized and can be representative of either be a thermometer weighted DAC, a Binary Weighted DAC, or a combination. In a Thermometer Weighted DAC, all N units are identical (i.e. equally sized with equal bias current), where [unit<0>=1x, unit<1>=1x, unit<2>=1x, unit<3>=1x, . . . unit<N-1>=1x], and 1x is the base unit current and/or size). In a Binary Weighted DAC, all N units are not identical, but scale for example in powers of two, i.e.

[unit<0>=1x, unit<1>=2x, unit<2>=4x, unit<3>=8x, ... unit<N-1>=(2^N)x], where 1x is the base unit current and/or size. We can also have a combination of Thermometer Weighted DACs and Binary Weighted DACS, which is called a segmented DAC approach.

Figure 8:
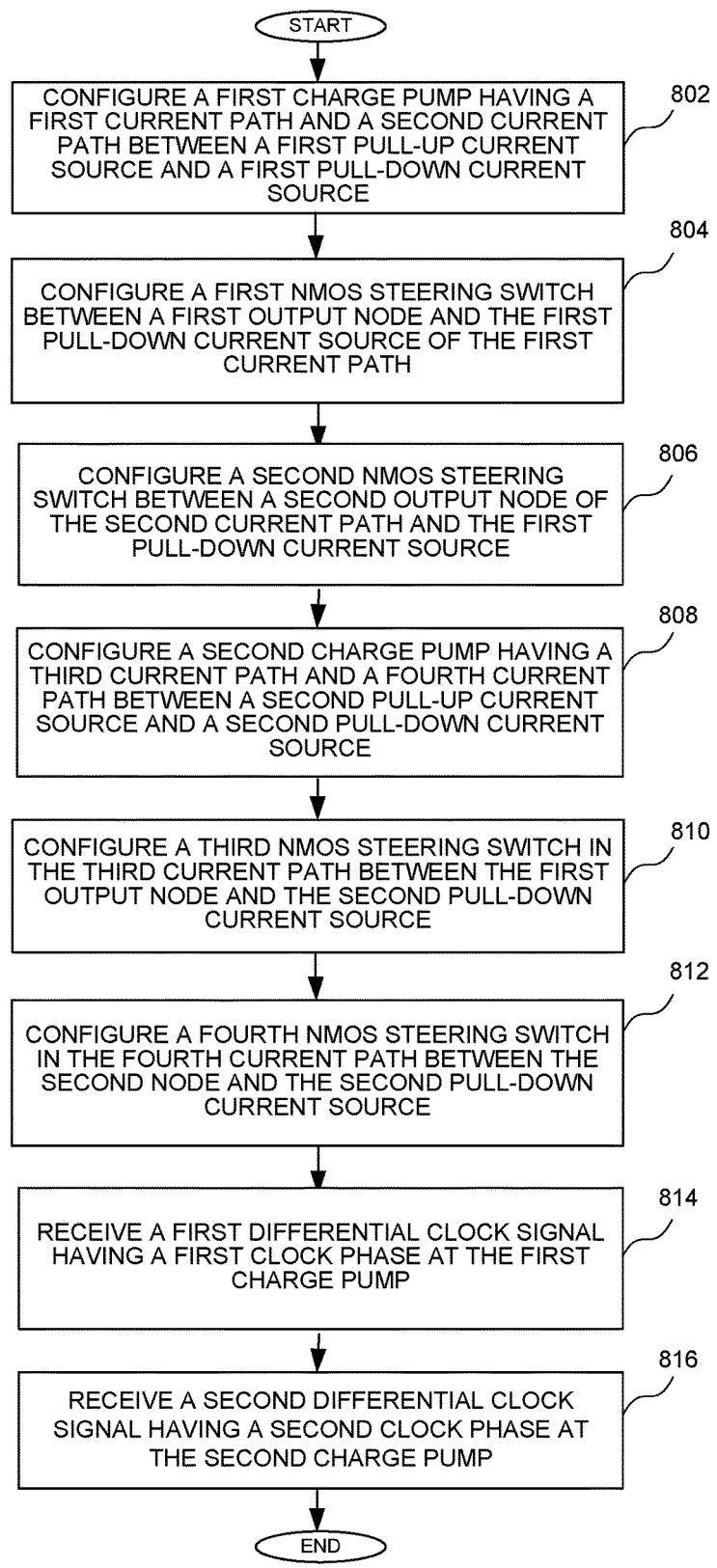
FIG. 8 is a flow chart showing a method of implementing a phase interpolator.

Turning now to FIG. 8, a flow chart shows a method of implementing a phase interpolator. The method of FIG. 8 could be implemented using the circuits of FIGS. 2, 5, 6 and 7 or other suitable circuits. A first charge pump having a first current path and a second current path is configured between a first pull-up current source and a first pull-down current source at a block 802. A first NMOS steering switch is configured between a first output node and the first pull-down current source of the first current path at a block 804. A second NMOS steering switch is configured between a second output node of the second current path and the first pull-down current source at a block 806. A second charge pump having a third current path and a fourth current path is configured between a second pull-up current source and a second pull-down current source at a block 808. A third NMOS steering switch in the third current path is configured between the first output node and the second pull-down current source at a block 810. A fourth NMOS steering switch in the fourth current path is configured between the second node and the second pull-down current source at a block 812. A first differential clock signal having a first clock phase is received at the first charge pump at a block 814. A second differential clock signal having a second clock phase is received at the second charge pump at a block 816. The output phase is a linear weighting of the two input phases (plus some fixed delay that is not dependent on the currents), where that weighting was decided by the values of the currents of the CP0 and CP1 charge pumps as described above.

While specific elements of the method of FIG. 8 are shown, it should be understood that additional elements of the method may be implemented according to other figures. For example, multiple charge pumps can be implemented in parallel as described in reference to FIGS. 5, 6 and 7, where either control logic or stacked switches can be implemented to enable particular charge pump units. Also, bias control can be implemented by implementing a transient bias control circuit for controlling current in the NMOS pull-down current sources, and another transient bias control loop circuit with the same basic topology can be used to control the PMOS pull-up current sources. Alternatively, a transient bias loop control circuit could be used for one of the current source types (NMOS or PMOS), while a common mode loop control circuit can be implemented for controlling current in the other current source type. Finally, if control of the bias current accuracy is not critical for a particular application, or if the application is at fixed frequency, a simple current mirror with constant current input current could be used to bias both the PMOS and NMOS current sources.

Figure 9:
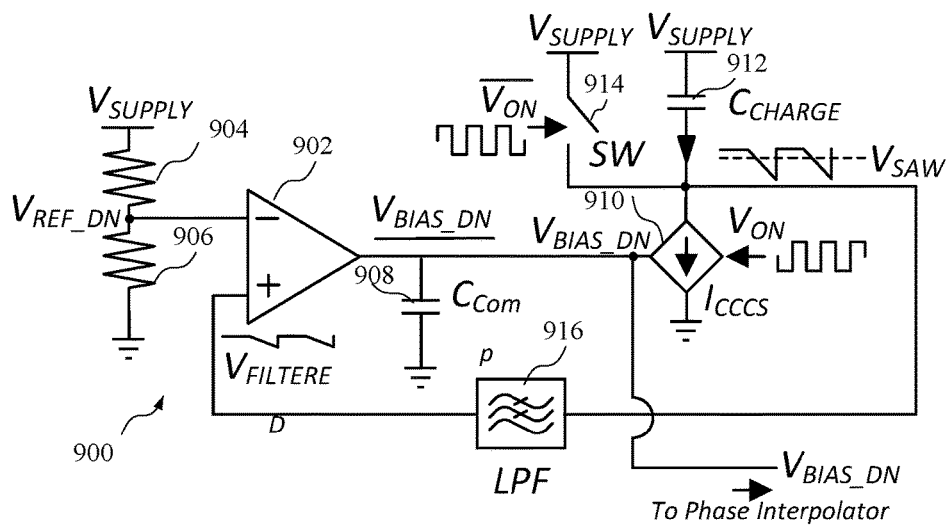
FIG. 9 is a block diagram of an NMOS bias signal generator.

Turning now to FIG. 9, a block diagram of a transient bias loop control circuit 900 for an NMOS current sink bias generator is shown. A differential amplifier 902 is coupled at a first input to a reference voltage ($V_{REF\_DN}$) formed by a resistor divider having a first resistor 904 coupled in series between the supply voltage and the reference voltage $V_{REF\_DN}$, and a second resistor 906 between $V_{REF\_DN}$ and ground. The resistor divider can be programmable. This reference voltage could also be generated by providing either fixed current or programmable DAC current into a resistor. An output of the differential amplifier 902 is coupled to a stabilization/ripple capacitor 908 and a replica current source 910 that is a replica of the current sources (220, 240) in the charge pump. The output of the differential amplifier 902 is a voltage bias ($V_{BIAS\_DN}$) that is coupled to the control signal inputs 221 and 241 to control current sources 220 and 240, respectively. A capacitor 912 is provided between the supply voltage and the current source 910, where a switch 914 coupled between the supply voltage and the current source 910 is configured to receive an inverted voltage on ($V_{ON}$_bar) signal to generate the $V_{SAW}$ wave as shown. The $V_{SAW}$ wave is coupled to a low pass filter (LPF) 916, whose filtered output ($V_{FILTERED}$) is provided to the other input of the differential amplifier 902. The bias control circuit of FIG. 9 implements a replica capacitor 912 of the capacitors 242 and 246 in the phase interpolator and a replica current source 910 that is a replica of the current sources (220, 240) in the charge pump. The bias control circuit provides a negative feedback loop that sets the current in the current sources in order to achieve a maximum charge pump swing that is user-defined and can be defined by $V_{REF\_DN}$ (for example, a fraction of the supply voltage). The swing can also be tuned by varying the ratio of the replica capacitor and charge pump $C_{mix}$ capacitors. By implementing a similar biasing circuit for the PMOS pull-up current sink (as described in reference to FIG. 10), the rising and fall slopes of the $V\varphi_{mix}$ and $V\varphi_{mix\_bar}$ are the same, leading to an output signal that is balanced and has no duty cycle distortion.

Figure 10:
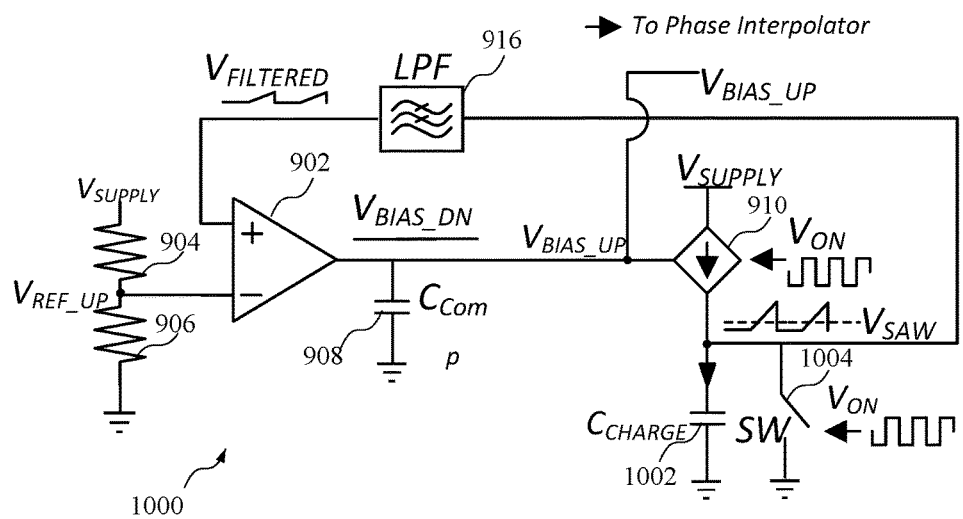
FIG. 10 is a block diagram of a PMOS bias signal generator.

Turning now to FIG. 10, a block diagram of a transient bias loop control circuit 1000 operating as a pull-up current sink bias generator for generating bias control signals coupled to control signal inputs 219 and 239 of current sources 218 and 238 is shown. The circuit of FIG. 10 is similar to the bias current generator circuit of FIG. 9, but the current source 910 is coupled to the supply voltage, where the current source 910 provides current to a capacitor 1002 that is configured to receive the $V_{SAW}$ wave in response to the switch 1004 controlled by the control signal $V_{ON}$. The pull-up bias voltage $V_{BIAS\_UP}$ is provided to the pull-up current sources 218 and 238 at inputs 219 and 239, respectively.

Improved linearity is achieved by keeping the current sources in saturation, which requires the careful setting of the minimum/maximum charge pump currents over the interpolation range for a given data rate. It may also be necessary to set the common mode of the output by fine-tuning/scaling the I0_UP/I0-DN and I1_UP/I1_DN current ratios appropriately. These currents could be controlled in an open loop arrangement (e.g. open loop current mirror for I0_UP and I0_DN and open loop current mirror for I1_UP and I1_DN). The currents could also be controlled in a closed loop fashion which could include, but not be limited to, a transient bias control dynamic replica loop to automatically set the current to achieve a required swing level in the charge pumps, as described previously in reference to FIGS. 9 and 10.

Figure 11:
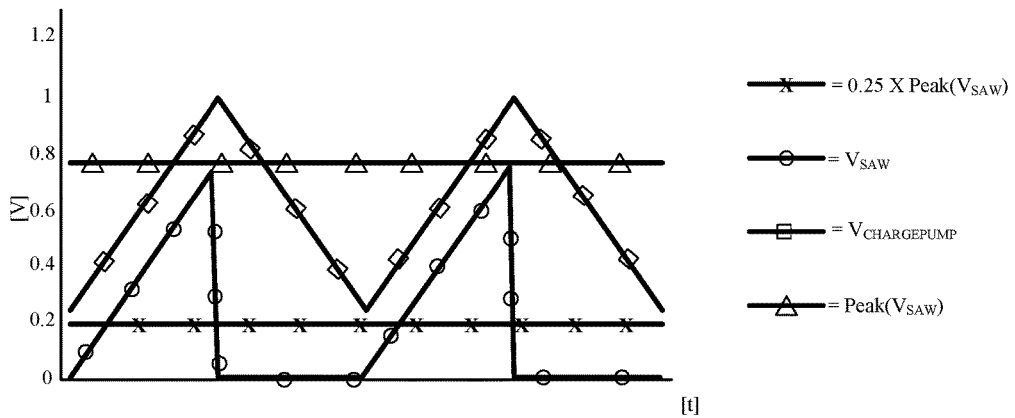
FIG. 11 is a block diagram of common mode loop control circuit for current source biasing.

The plot of FIG. 11 shows signals associated with the operation of the transient bias control loop for the circuit of FIG. 10. The average value ($V_{saw}$) used as a reference is the resistor divider value fed to the operational amplifier in FIG. 10, where:

Average($V_{saw}$)~=0.25*Peak($V_{saw}$);

therefore, Peak($V_{saw}$)~=4*Average($V_{saw}$); and therefore, peak-to-peak ($V_{chargepump}$)~=4*Average ($V_{SAW}$).

It is possible to tune or select the maximum amplitude in the charge pump by tuning the resistor divider ratio (or by tuning a DAC current and/or resistor if they are used for of generating $V_{REFUP}$). For example, if the average value (Vsaw) is changed, the peak amplitude in the mixer will be changed. The bias circuit can be a scaled (i.e. implemented as a smaller version) of the phase interpolator, for lower power consumption. In the case where the bias circuit current source is a scaled replica, if the mixer capacitor Cmix in the replica is also scaled, the equation should approximately hold true, to a first order.

Figure 12:
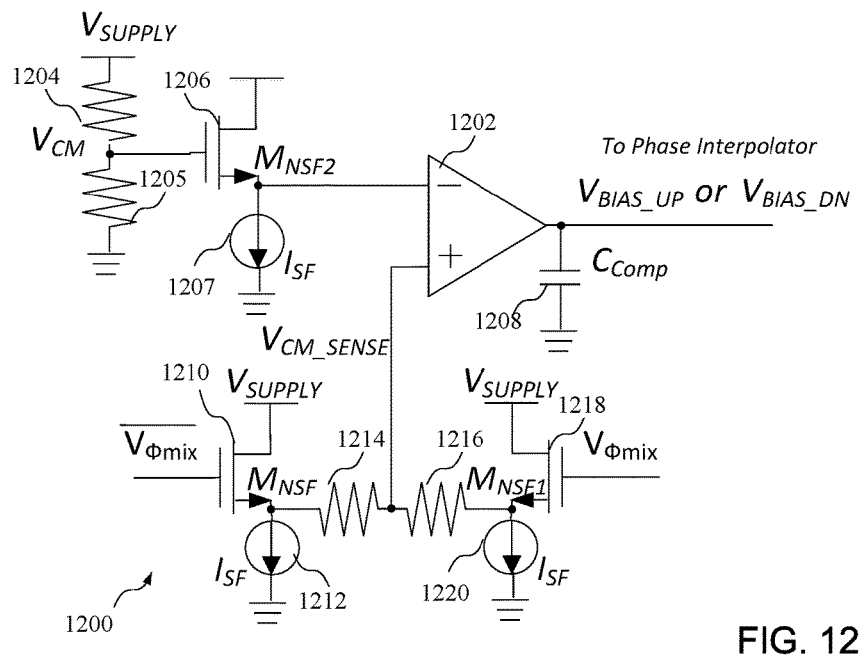
FIG. 12 is a plot showing the operation of the common mode loop control circuit.

Turning now to FIG. 12, a block diagram of a common mode loop control circuit 1200 for current source biasing is shown, where the circuit of FIG. 12 could be implemented to control the current sources 218 and 238 and the bias control circuit of FIG. 9 could be implemented to control the current source 220 and 240. The circuit of FIG. 12 comprises a differential amplifier 1202 configured to receive a reference common mode voltage ($V_{CM}$) at a first input, which could, be but is not limited to a node between a first resistor 1204 and a second resistor 1205 forming a resistor divider. The reference common mode voltage ($V_{CM}$) is received at a gate of a transistor 1206 having a current source 1207 coupled to a source of the transistor at an input of the differential amplifier 1202A stabilization/ripple capacitor 1208 is coupled to an output of the differential amplifier which generates a bias signal that is coupled to a current source of a phase interpolator, in this instance, the current sources 218 and 238 as described above. A buffered common mode sense control signal ($V_{CM\_SENSE}$) signal coupled to a second input of the differential amplifier 1202. The $V_{cm\_SENSE}$ signal is generated by a resistor divider in conjunction with a pair of source follower amplifier buffers (where unity-gain-configured operational amplifiers could also be used), each consisting of a gain transistor and a current source. A first gain transistor 1210 coupled between the supply voltage and a current source 1212. A node between a first resistor 1214 and a second resistor 1216 is coupled to a second input of the differential amplifier 1202. A source of a gain transistor 1218 is coupled to a second terminal of the resistor 1216 at a current source 1220, where the gates of the transistors 1218 and 1210 are configured to receive the $V\varphi_{mix}$ and $V\varphi_{mix}$_bar signals, respectively.

The common mode loop control circuit of FIG. 12 automatically controls the phase interpolator's output voltage common mode ("Vcm"). The reference common mode voltage could be generated as a fraction of the supply as shown or using a DC current injected into a resistor, referenced by either supply. It would be possible to swap PMOS devices for NMOS devices, and change the supply to which the signals are referenced. Any combination of the above bias methods could be used (e.g. a mix of open loop and closed loop, or two dynamic replica loops, including one for the current sink control, one for current source control).

The biasing and control circuit 250 may comprise a pull-up current source control circuit and a pull-down current source control circuit, which may be the same type of circuit or a different type of circuit. One or both of the pull-up current source control circuit and the pull-down current source control circuit may be an open loop control circuit, where control loops are not used for setting the currents. They are optimally set once, for example manually during a design phase. An appropriate fixed $V_{biasN}$ voltage (and fixed $V_{biasNcasc}$ if it is a cascaded current source) is applied for NMOS current source, and an appropriate fixed $V_{biasP}$ voltage (and fixed $V_{biasPcasc}$ if it is a cascaded current source) is applied for PMOS current source. The pull-up and pull-down current source control circuits may also be implemented as a transient bias loop control circuit as described in FIGS. 9 and 10, or a common mode loop control circuit as described in FIG. 11. While specific combinations of control circuits for generating bias signals for the pull-up and pull-down current sources are described, it should be understood that the biasing and control circuit 250 can comprise any combination, including an open loop control circuit for the NMOS current source and common mode loop control circuit for the PMOS current source; an open loop control circuit for the PMOS current source and common mode loop control circuit for the NMOS current source, a transient bias loop for PMOS current source and transient bias loop control circuit for NMOS current source; a transient bias loop control circuit for NMOS current source and common mode loop control circuit for PMOS current source; and a transient bias loop control circuit for PMOS current source and common mode loop control circuit for NMOS current source.

Figure 13:
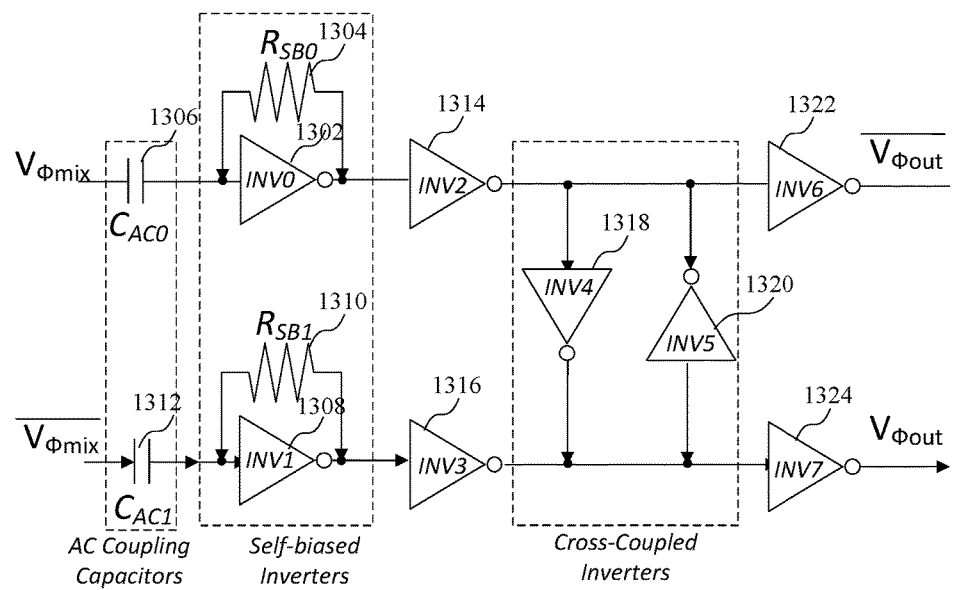
FIG. 13 is a block diagram of a buffer and current mirror signaling conditioning circuit.

Turning now to FIG. 13, a block diagram of an optional buffering and signaling conditioning circuit 252 is shown. In particular, the $V\varphi_{mix}$ and $V\varphi_{mix}$_bar signals are coupled to first and second paths having AC coupling capacitors, self-biased inverters and cross-coupled inverters to generate the output signals $V\varphi_{out}$ and $V\varphi_{out}$_bar. More particularly, an inverter 1302 having a resistor 1304 coupled between the inputs and outputs of the inverter is coupled to a first terminal of a capacitor 1306, a second terminal of which is coupled to receive the $V\varphi_{mix}$ signal. A second inverter 1308 having a resistor 1310 coupled between the inputs and outputs of the inverter is coupled to a first terminal of a capacitor 1312, a second terminal of which is coupled to receive the $V\varphi_{mix}$_bar signal. An output of the inverter 1302 is coupled to a second inverter 1314, an output of which is coupled to an input of an inverter 1318 and an output of an inverter 1320, which are cross-coupled inverters, and an input of the inverter 1322. An output of the inverter 1308 is coupled to an inverter 1316, an output of which is coupled to an output of inverter 1318 and an input of inverter 1320, and an input of the inverter 1324. $V\varphi_{out}$ and $V\varphi_{out}$_bar signals are generated at the outputs of the inverters 1322 and 1324 based upon the $V\varphi_{mix}$ and $VC\varphi_{mix}$_bar signals.

The buffer circuits of FIG. 13, or portions of them can be placed after the phase interpolator to isolate the phase interpolator, to boost its drive capability, and to correct for any residual DCD in either the phase interpolator or the buffer circuits themselves. The phase interpolator output voltage VφMixd is AC coupled using coupling capacitors 1306 and 1312 and fed to a self-biased inverter (or replica-biased inverter where the replica is self-biased and the output voltage is fed through an isolation resistor to the signal-chain buffer). The circuit arrangement of FIG. 13 has desirable properties such as filtering out low frequency duty cycle distortion, or any dependency the phase interpolator output common mode may have on the chosen output phase. It also ensures the DC bias is always at the trip/trigger point of the first CMOS inverter in the chain, thus giving a conversion between the non-full-scale signal characteristics of the phase interpolator to the full-scale CMOS levels. If residual duty cycle distortion is still seen at the output, it may be reduced by including the cross-coupled inverters 1318 and 1320 that exhibit positive feedback to reduce duty cycle distortion.

Figure 14:
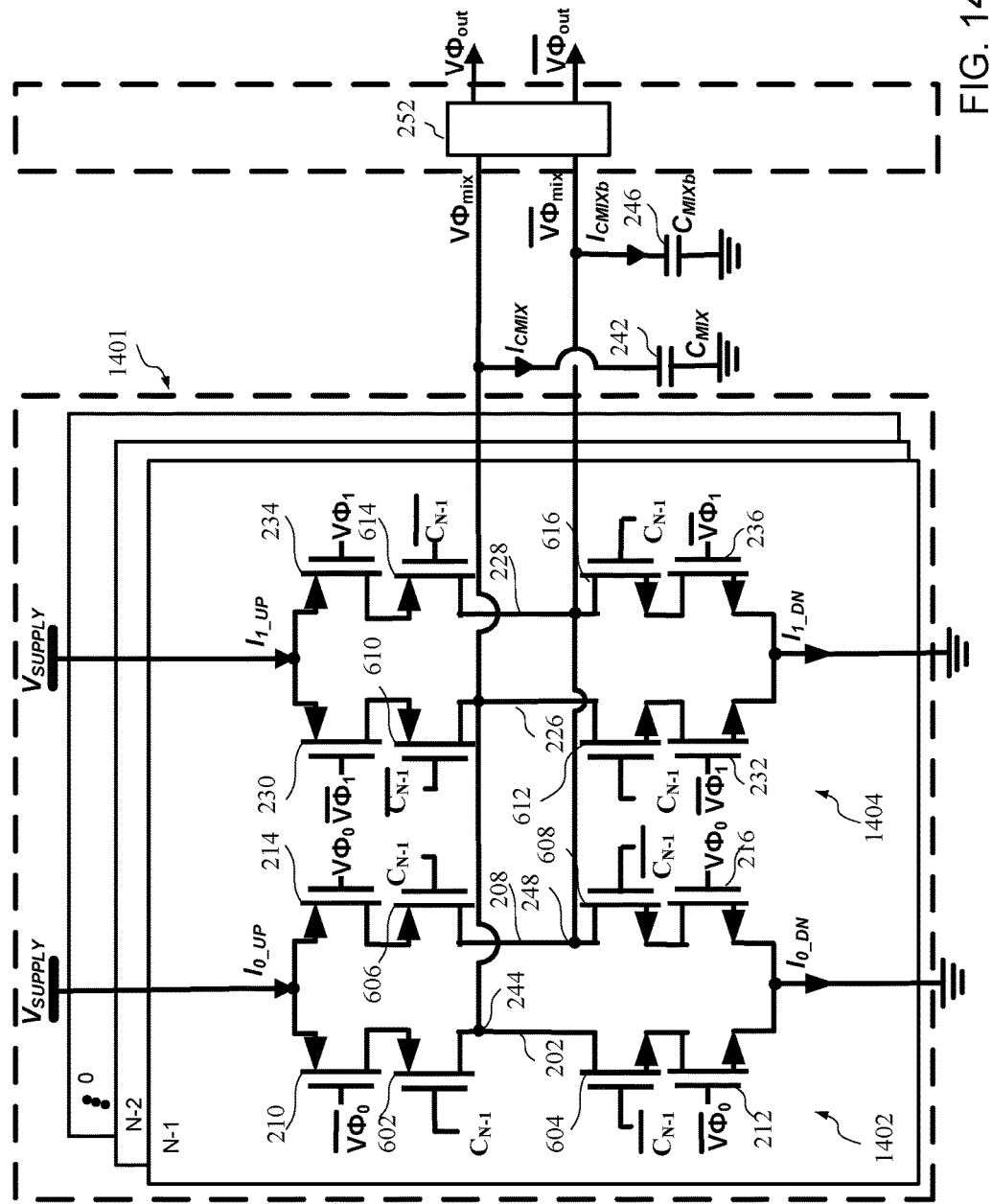
FIG. 14 is a block diagram of a phase interpolator having parallel stages.

Turning now to FIG. 14, a block diagram of a phase interpolator having parallel stages is shown. The circuit of FIG. 14 includes the elements of FIG. 6, except that the current sources have been removed. A phase interpolator comprises an array of current steering charge pumps 1401. Each current steering charge pump comprises a first charge pump 1402 configured to receive a first differential clock signal having a first clock phase, wherein the first charge pump has a first current path and a second current path, wherein the first current path comprises a first NMOS steering switch coupled between a first output node and ground and the second current path comprises a second NMOS steering switch coupled between a second output node and ground. Each current steering charge pump also comprises a second charge pump 1404 configured to receive a second differential clock signal having a second clock phase, wherein the second charge pump has a third current path and a fourth current path, wherein the third current path comprises a third NMOS steering switch coupled between the first output node and ground and the fourth current path comprises a fourth NMOS steering switch coupled between the second node and ground. It should be noted that the circuit includes no analog current sources, where additional DAC current source units (which may be implemented as binary or thermometer DAC current sources) may be used to adjust the current in order to tune the output slope. For example, an additional M current source units, where each of the M units is implemented as the N-1 unit shown in FIG. 14, could be implemented. For example, these M units could be split amongst the N units in order to calibrate each of the N units, or could be implemented separately to provide an overall correction which could have a different value for each code value. A total required correction value could be calculated based upon all N units being switched on, where the output phase can be changed by turning off more of the units in one charge pump and turning on more of the units in another charge pump, and therefore switch the correction units from one charge pump to another charge pump. Although N units are shown in FIG. 14 by way of example, it should be understood that M+N−1 units could be employed, where the additional M units could be dispersed among the N units as set forth above. A calibration loop to configure the charge pumps could be implemented as described in reference to FIG. 15.

Figure 15:
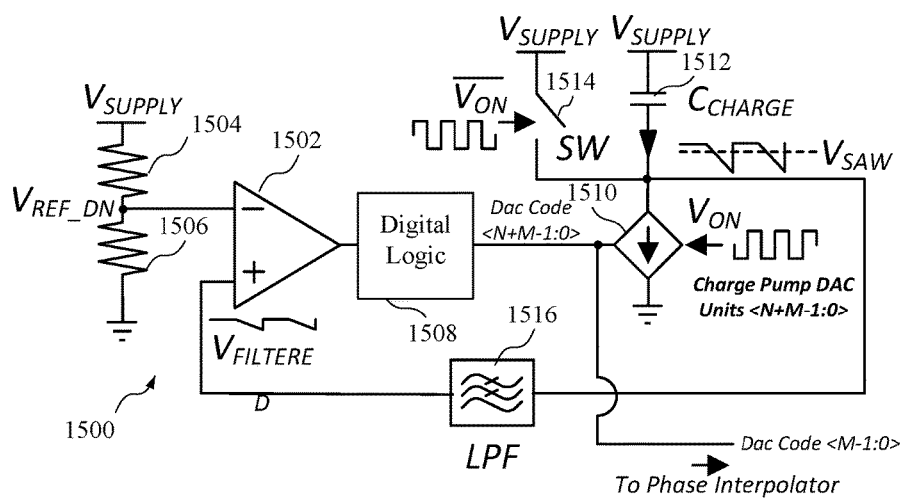
FIG. 15 is a block diagram of current sink calibration control circuit for controlling the current in the parallel stages of FIG. 14.

Turning now to FIG. 15, a block diagram of current sink DAC calibration control circuit for controlling the current in the parallel stages of FIG. 14 is shown. A comparator 1502 is coupled at a first input to a reference voltage ($V_{REF\_DN}$) formed by a resistor divider having a first resistor 1504 coupled in series between the supply voltage and the reference voltage $V_{REF\_DN}$, and a second resistor 1506 between $V_{REF\_DN}$ and ground. An output of the comparator 1502 is coupled to a digital logic circuit 1508 and a replica current source 1510 that is a replica of the current sources (220, 240) in the charge pump. The output of the comparator 1502 is a DAC code ($C_{N+M-1:0}$) that is coupled to the control transistors 602-616. A capacitor 1512 is provided between the supply voltage and the current source 1510, where a switch 1514 coupled between the supply voltage and the current source 1510 is configured to receive an inverted voltage on ($V_{ON}$_bar) signal to generate the $V_{SAW}$ wave as shown. The $V_{SAW}$ wave is coupled to a low pass filter (LPF) 1516, whose filtered output ($V_{FILTERED}$) is provided to the other input of the comparator 1502.

While specific implementations of phase interpolators, biasing and signal-conditioning are shown, various modifications could be implemented. For example, non-linear current or device-size weightings could be applied to address implementation-specific non-linearity trends. The two single-ended mixing capacitors could be replaced with one differential capacitor. The capacitor implemented in the circuits could be realized in various forms, including a metal-oxide capacitor, a MOS capacitor (single-ended or back-to-back connected), or a deep NWELL type capacitor (single-ended or back-to-back connected). With appropriate choice and/or multiplexing of the input signals (clocks, select/enable codes etc.) and appropriate weighting of $I_0$ and $I_1$, continuous 360 degree phase rotation can be achieved. The current DACs could have cascodes to isolate capacitance. CML buffer/mixer differential pairs could be implemented to integrate a capacitive load to achieve phase interpolation.

It can therefore be appreciated that new phase interpolators and methods of implementing a phase interpolator have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A phase interpolator comprising:
a first charge pump configured to receive a first differential clock signal having a first clock phase, wherein the first charge pump has a first current path and a second current path coupled between a first pull-up current source and a first pull-down current source, wherein the first current path comprises a first NMOS steering switch coupled between a first output node and the first pull-down current source and the second current path comprises a second NMOS steering switch coupled between a second output node and the first pull-down current source;

a second charge pump configured to receive a second differential clock signal having a second clock phase, wherein the second charge pump has a third current path and a fourth current path coupled between a second pull-up current source and a second pull-down current source, and wherein the third current path comprises a third NMOS steering switch coupled between the first output node and the second pull-down current source and the fourth current path comprises a fourth NMOS steering switch coupled between the second node and the second pull-down current source; and a transient bias loop control circuit for controlling current in a pair of first and second current sources and a common mode loop control circuit for controlling current in a pair of third and fourth current sources, where the pair of first and second current sources is one of a pair of the first and second pull-up current sources and a pair of the first and second pull-down current sources, and where the pair of the third and fourth current sources is the other of the pair of the first and second pull-up current sources and the pair of the first and second pull-down current sources.

2. The phase interpolator of claim 1 wherein the first NMOS steering switch comprises a stacked switch having a first plurality of NMOS switches coupled in series and the second NMOS steering switch comprises a stacked switch having a second plurality of NMOS switches coupled in series, and wherein the third NMOS steering switch comprises a stacked switch having a third plurality of NMOS switches coupled in series and the fourth NMOS steering switch comprises a stacked switch having a fourth plurality of NMOS switches coupled in series.

3. The phase interpolator of claim 1 further comprising:
a third charge pump configured to receive the first differential clock signal having the first clock phase, wherein the third charge pump has a fifth current path and a sixth current path coupled between a third pull-up current source and a third pull-down current source, wherein the fifth current path comprises a fifth NMOS steering switch coupled between a first output node and the third pull-down current source and the sixth current path comprises a sixth NMOS steering switch coupled between a second output node and the third pull-down current source; and a fourth charge pump configured to receive the second differential clock signal having the second clock phase, wherein the second charge pump has a seventh current path and an eighth current path between a fourth pull-up current source and a fourth pull-down current source, wherein the seventh current path comprises a seventh NMOS steering switch coupled between the first output node and the fourth pull-down current source and the eighth current path comprises an eight NMOS steering switch coupled between the second node and the fourth pull-down current source.

4. The phase interpolator of claim 1 wherein each current path comprises a plurality of stacked switches having a first switch configured to receive a phase of the clock signal at a first control terminal and a second switch configured to receive a control signal at a second control terminal.

5. The phase interpolator of claim 4 wherein a stacked switch of the plurality of stacked switches comprises a first PMOS transistor configured to receive a clock phase of a differential clock signal at a first control terminal and coupled between a first pull-up current source and a second PMOS transistor configured to receive a control signal at a second control terminal.

6. The phase interpolator of claim 4 wherein each of the NMOS steering switches comprises a first NMOS transistor configured to receive a control signal at a first control terminal and a second NMOS transistor configured to receive a clock phase of a differential clock signal at a second control terminal.

7. The phase interpolator of claim 1 further comprising a first PMOS transistor coupled in series between the first pull-up current source and the first NMOS steering switch and a second PMOS transistor coupled in series between the second pull-up current source and the second NMOS steering switch.

8. The phase interpolator of claim 1 further comprising a capacitor coupled between the first output node and the second output node.

9. The phase interpolator of claim 1 further comprising a first capacitor coupled between the first output node and ground and a second capacitor coupled between the second output node and ground.

10. The phase interpolator of claim 1 further comprising a buffering and signal conditioning circuit coupled to the first output node and the second output node.

11. A phase interpolator comprising:
an array of current steering charge pumps, each of the current steering charge pumps comprising:
a first charge pump configured to receive a first differential clock signal having a first clock phase, wherein the first charge pump has a first current path and a second current path coupled between a first pull-up current source and a first pull-down current source, wherein the first current path comprises a first NMOS steering switch coupled between a first output node and ground and the second current path comprises a second NMOS steering switch coupled between a second output node and ground;

a second charge pump configured to receive a second differential clock signal having a second clock phase, wherein the second charge pump has a third current path and a fourth current path coupled between a second pull-up current source and a second pull-down current source, wherein the third current path comprises a third NMOS steering switch coupled between the first output node and ground and the fourth current path comprises a fourth NMOS steering switch coupled between the second node and ground; and a transient bias loop control circuit for controlling current in a pair of first and second current sources and a common mode loop control circuit for controlling current in a pair of third and fourth current sources, where the pair of first and second current sources is one of a pair of the first and second pull-up current sources and a pair of the first and second pull-down current sources, and where the pair of the third and fourth current sources is the other of the pair of the first and second pull-up current sources and the pair of the first and second pull-down current sources.

12. The phase interpolator of claim 11 wherein the first NMOS steering switch comprises a stacked switch having a first plurality of NMOS switches coupled in series and the second NMOS steering switch comprises a stacked switch having a second plurality of NMOS switches coupled in series, and wherein the third NMOS steering switch comprises a stacked switch having a third plurality of NMOS switches coupled in series and the fourth NMOS steering switch comprises a stacked switch having a fourth plurality of NMOS switches coupled in series.

13. The phase interpolator of claim 11 further comprising a DAC calibration control circuit configured to provide control signals to each of the first NMOS steering switch, the second NMOS steering switch, the third NMOS steering switch, and the first NMOS steering switch.

14. The phase interpolator of claim 11 further comprising a first PMOS transistor coupled in series between the first pull-up current source and the first NMOS steering switch and a second PMOS transistor coupled in series between the second pull-up current source and the second NMOS steering switch.

15. The phase interpolator of claim 11 further comprising a capacitor coupled between the first output node and the second output node.

16. The phase interpolator of claim 11 further comprising a first capacitor coupled between the first output node and ground and a second capacitor (246) coupled between the second output node and ground.

17. The phase interpolator of claim 11 further comprising a buffering and signal conditioning circuit coupled to the first output node and the second output node.

* * * * *